(12) United States Patent
Groeneweg

(10) Patent No.: US 7,912,440 B2
(45) Date of Patent: Mar. 22, 2011

(54) APPARATUS FOR FILTERING A REFERENCE VOLTAGE AND MOBILE PHONES COMPRISING SUCH APPARATUS

(75) Inventor: Willem Hendrik Groeneweg, Muri (CH)

(73) Assignee: ST-Ericsson SA, Plan-les-Ouates (CH)

( * ) Notice: Subject to any disclaimer, the term of this patent is extended or adjusted under 35 U.S.C. 154(b) by 310 days.

(21) Appl. No.: 11/719,538

(22) PCT Filed: Nov. 10, 2005

(86) PCT No.: PCT/IB2005/053708
§ 371 (c)(1),
(2), (4) Date: May 1, 2009

(87) PCT Pub. No.: WO2006/054213
PCT Pub. Date: May 26, 2006

(65) Prior Publication Data
US 2009/0305747 A1 Dec. 10, 2009

(30) Foreign Application Priority Data
Nov. 16, 2004 (EP) .................................. 04300794

(51) Int. Cl.
*H04B 1/28* (2006.01)
(52) U.S. Cl. .......... 455/333; 455/91; 455/212; 455/332; 455/342

(58) Field of Classification Search ................... 455/333
See application file for complete search history.

(56) References Cited

U.S. PATENT DOCUMENTS

| 6,657,481 | B2 | 12/2003 | Rasmussen et al. |
| 7,031,689 | B2 * | 4/2006 | Frank .............................. 455/333 |
| 7,551,901 | B2 * | 6/2009 | Khorram .......................... 455/91 |
| 2001/0045850 | A1 | 11/2001 | Kuroda |
| 2002/0084840 | A1 | 7/2002 | Tsuchi |
| 2003/0234680 | A1 | 12/2003 | Erckert |

* cited by examiner

*Primary Examiner* — Duc Nguyen
*Assistant Examiner* — Ajibola Akinyemi
(74) *Attorney, Agent, or Firm* — Robert Iannucci; Seed IP Law Group PLLC

(57) ABSTRACT

Apparatus (40) comprising a voltage input (49) for applying an unfiltered voltage (V_unfil) and a current input (48) for receiving a bias current (Ib) from a current source. The apparatus (40) further comprises a differential filtering resistive circuit with a first current mirror (44) and a second current mirror (43), being situated between a common output node (50) and said voltage input (49). A first mirror circuit (42) for mirroring the bias current (Ib) to said first current mirror (44), and a second mirror circuit (41) for mirroring a current (Ix) to said second current mirror (43) are employed. A filter capacitor (51) situated at the output side of the apparatus (40), said filter capacitor (51) being connected on one side to said common output node (50) and on the other side to ground. The apparatus (40) provides a filtered output voltage (V_fil) at said common output node (50).

12 Claims, 5 Drawing Sheets

APPARATUS FOR FILTERING A REFERENCE VOLTAGE AND MOBILE PHONES COMPRISING SUCH APPARATUS

FIELD OF THE INVENTION

The present invention concerns an apparatus providing for a filtered voltage and mobile phones making use of such an apparatus.

BACKGROUND OF THE INVENTION

In many mixed-signal integrated circuits, a bandgap voltage reference is used. This bandgap voltage may show interferences. For suppressing the interferences, normally an internal resistor 11 and an external filter capacitor 13 is used, as depicted in FIG. 1. For this purpose, the respective chip comprises a pad in order to allow the external filter capacitor 13 of suitable capacitance to be connected to the chip. The voltage at the output node 14 is filtered and serves in the present example as input signal of a plurality of buffers 12.

Another circuit, which needs filtering, is illustrated in FIG. 2. It divides the power supply voltage VDD, for instance to half its value, and is then used for controlling the optimum working point of output stages 22. The dividing of the power supply voltage VDD is done by means of two resistors 21. One may also employ two CMOS transistors instead. Also in this circuit an external filter capacitor 23 is used, as depicted in FIG. 2.

Yet another circuit, where filtering of the power supply voltage VDD provided by a bandgap voltage source 30 is required, is depicted in FIG. 3. In this circuit an external capacitor 33 is required, too. A programmable gain stage 32 is employed which amplifies the reference voltage provided by the bandgap voltage source 30 and filtered by the external capacitor 33. The output of the gain stage 32 can be used for the same purpose as in FIG. 2.

These state-of-the-art systems have drawbacks. The external components of FIGS. 1 through 3 add pads to the respective chips and add pins to the chip packages. Furthermore, these approaches add area to the print and cost to the bill of materials. It is a disadvantage of the circuit depicted in FIG. 3, that the gain stage 32 must be programmed by software in conjunction with measurement of the voltage provided by a battery. This needs a simple routine. If not available, a standard setting will be chosen which does not guarantee an optimum output stage working point at extreme supply voltages.

The above summarizes state of the art approaches being described in the technical literature and in related patents. In the U.S. Pat. No. 6,657,481 specific current mirror circuits are proposed. The circuits disclosed in this patent just comprise PMOS transistors. The main drawback of such a circuit, if used in a filter structure, is that the circuit is only able to charge the capacitor. This will lead to a rising voltage on the capacitor if interferences are present. The U.S. Pat. No. 6,657,481 does not offer a solution for filtering a reference voltage.

Thus, it would be generally desirable to provide a solution allowing on-chip filtering of a reference voltage. Furthermore, there is a demand for special circuits that can be employed in a mobile phone where the supply voltage, as supplied by a battery, fluctuates if the mobile phone is in a transmit mode.

It is thus an object of the present invention to provide an apparatus for improved filtering of a supply voltage that preferably does not require an external capacitor., It is a further objective of the present invention to provide an apparatus for improved filtering of a supply voltage for employment in battery comprising mobile phone.

SUMMARY OF THE INVENTION

These disadvantages of known systems, as described above, are reduced or removed with the invention as described and claimed herein.

An apparatus in accordance with the present invention is claimed in claim 1. Various advantageous embodiments are claimed in claims 2 through 9. A mobile phone according to the present invention is claimed in independent claim 10 and advantageous embodiments are claimed in claims 11 and 12.

According to the present invention, an apparatus, also referred to as on-chip filter apparatus, is provided that comprises a voltage input for applying an unfiltered voltage and a current input for receiving a bias current. A differential filtering resistive element is employed that comprises a first current mirror (e.g., a PMOS current mirror) and a second current mirror (e.g., an NMOS current mirror). These current mirrors are situated between a common output node and the voltage input. A filtering stage with a first mirror circuit and a second mirror circuit are provided. A filter capacitor is situated at the output side of the apparatus. It is connected between the common output node and ground. This apparatus provides a filtered output voltage at the common output node.

The proposed on-chip filter apparatus can be used for applications where a bandgap reference voltage (cf. FIG. 1) needs to be filtered, for applications where a voltage divider (cf. FIG. 2) is required, and for applications similar to the one depicted in FIG. 3. It may be employed to achieve cost savings by eliminating the pad and the external capacitors, but it may also be employed with an external capacitor.

Additional features and advantages of the invention will be set forth in the description that follows, and in part will be apparent from the description.

BRIEF DESCRIPTION OF THE DRAWINGS

For a more complete description of the present invention and for further objects and advantages thereof, reference is made to the following description, taken in conjunction with the accompanying drawings, in which.

DESCRIPTION OF PREFERRED EMBODIMENTS

Figure 4:
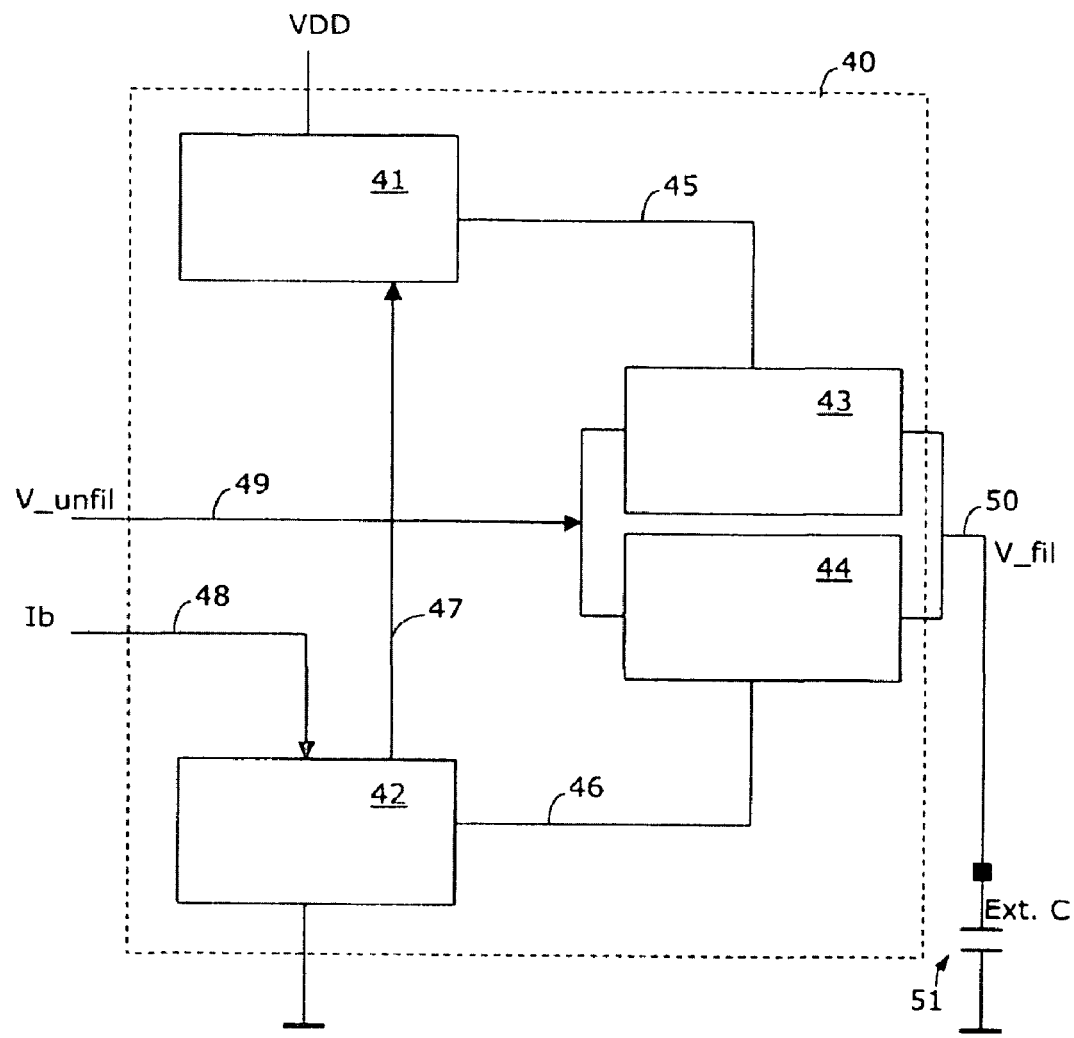
FIG. 4 shows a schematic block diagram of a first apparatus, according to the present invention.

A first apparatus 40, according to the present invention, is illustrated in FIG. 4. The apparatus 40 comprises a voltage input 49 for applying an unfiltered voltage V_unfil and a current input 48 for receiving a bias current Ib (e.g. from a global current source). A differential filtering resistive element is employed that comprises a PMOS current mirror 44 and an NMOS current mirror 43. These current mirrors 43, 44 are situated between a common output node 50 and the voltage input 49. A filtering stage with a first mirror circuit 42 and a second mirror circuit 41 are provided. A filter capacitor 51 is situated at the output side of the apparatus 40. As illustrated in FIG. 4, the capacitor 51 may be an external capacitor C which is connected between the common output node 50 and ground. This apparatus 40 provides a filtered output voltage V_fil at the common output node 50. In a preferred embodiment, however, this capacitor is part of the apparatus (cf. FIG. 6 for instance). In this case, no external capacitor or only a small external capacitor is: required.

The first mirror circuit 42 provides via a connection 47 a current to the second mirror circuit 41 and via a connection 46 a current to the PMOS current mirror 44. The PMOS current mirror 44 and the NMOS current mirror 43 are arranged so that a current can flow via the output node 50 into or out of the capacitor 51 to charge or discharge it. That is, with the present apparatus 40 it is also possible to sink a current out of the capacitor 51. In this case the current discharges the capacitor and flows into the apparatus 40. Due to this, if the unfiltered voltage V_unfil rises, the filtered voltage V_fil will correctly track with it.

It is a further advantage of the apparatus 40 that it has a long settling time for a changing unfiltered voltage V_unfil, which can occur at supply changes or spurious transients. That is, a changing unfiltered voltage V_unfil has no or almost no impact on the filtered voltage V_fil at the output node 50.

The unfiltered voltage V_unfil may be provided by a bandgap source. The bias current Ib may be supplied by a global current source that is available in the circuit where the apparatus is being employed. It is also possible, however, to provide a current source inside the apparatus 40. The supply voltage VDD may be provided by a regulated source from the battery for example (VDD=Vbat). In a preferred embodiment, this supply voltage VDD is about 2.7 V and the unfiltered (bandgap) voltage V_unfil is 1.2 or 1.25 V.

Figure 5A:
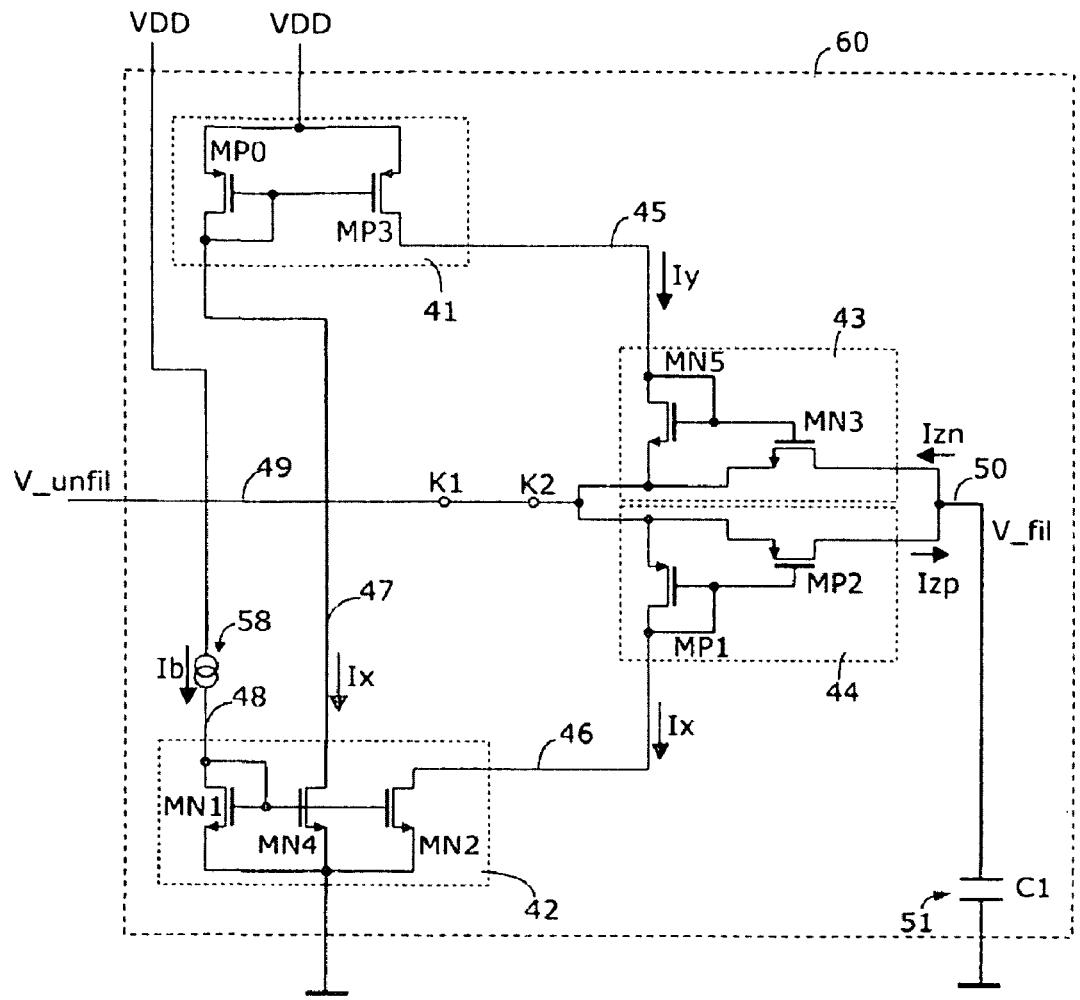
FIG. 5A shows a more detailed block diagram of a second apparatus, according to the present invention.

Details of an embodiment similar to the one depicted in FIG. 4 are illustrated in FIG. 5A. The apparatus 60 comprises a voltage input 49 where an unfiltered voltage V_unfil is applied. Furthermore, the apparatus 60 comprises a current input 48 for receiving a bias current Ib. In the present embodiment, there is a current source 58 that provides the bias current Ib. An output stage comprises a differential filtering resistive element with a complementary arrangement of a PMOS current mirror 44 and an NMOS current mirror 43. The current mirrors 44, 43 are situated between a common output node 50 and the voltage input 49. A filtering stage with a first mirror circuit 42 for mirroring the bias current Ib to the PMOS current mirror 44, and a second mirror circuit 41 for mirroring a current Ix to the NMOS current mirror 43 are provided. A filter capacitor C1 is situated at the output side of the apparatus 60. In the present embodiment, this capacitor C1 is an integral part of the circuit (on-chip capacitor), that is, there is no need for a contact pad for connecting an external capacitor. The filter capacitor C1 is on one side connected to the common output node 50 and on the other side to ground. A filtered output voltage V_fil is provided at said common output node 50.

The NMOS current mirror 42 may comprise three NMOS transistors MN1, MN2, and MN4, as illustrated in FIG. 5A. The first NMOS transistor MN1 may have a gate width W=40 m and a gate length L=2 m. The two transistors MN2 and MN4 have a width W=2 m and a length L=10 m. In this case, the mirror ratio is rather small (about 1/100) and the mirror currents Ix are about Ib/100. Since the transistors MN2 and MN4 have the same dimensions, the currents Ix flowing in the connections 46 and 47 are approximately the same.

The second current mirror 41 is a PMOS current mirror. It comprises in the present embodiment two PMOS transistors MP0 and MP3. Both transistors have the same dimensions and the current mirror 41 provides a mirror current Iy via the connection 45 to the current mirror 43 with Iy≈Ix.

The two current mirrors 43 and 44 also have high mirror ratios so that the PMOS current mirror 44 is able to feed a very small current Izp via the node 50 into the capacitor C1 to charge it. The NMOS current mirror 43, however, is able to sink a very small current Izn via the node 50 out of the capacitor C1. This mirror 43 is thus able to de-charge the capacitor C1. The respective circuit 43, 44 of the apparatus 60 is now symmetrical and will react similarly to rising and falling transients on the unfiltered voltage V_unfil. One of the two mirrors 43, 44 will be conductive until the voltage V_fil at the output node 50 reaches the voltage V_unfil. Since in this case there is no drain source (VDS) voltage anymore, no current Iz is flowing.

Fast (rising and falling) transients of the voltage V_unfil will require some time until they reach the output voltage V_fil, since the transients have to be coupled through the mirrors 43, 44. The mirrors 43, 44 provide for the filtering of the unfiltered voltage V_unfil, since the combination of mirrors 43, 44 and capacitor C1 have a long time constant τ=RC (e.g., τ=40 ms through 160 ms). Due to the non-linear behavior of the series elements MP2 and MN3 in FIG. 5A, the apparatus 40 and 60 both react fast for large transients and slow for small ones. This helps to filter out (small) unwanted power supply (VDD) ripple or noise.

The two embodiments illustrated in FIG. 4 and FIG. 5A comprise a complementary arrangement of first current mirror 44 and a second current mirror 43, where the first current mirror 44 is a PMOS current mirror and the second current mirror 43 is an NMOS current mirror. Instead of these PMOS and NMOS current mirrors one might use complementary arrangement of bipolar transistors as well.

Figure 6:
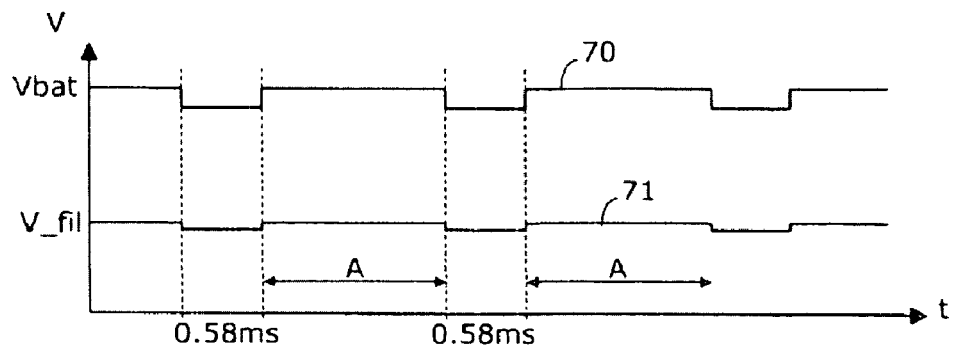
FIG. 6 shows a schematic diagram of the battery voltage and the filtered voltage in a mobile phone.

In FIG. 6 a typical problem is shown that occurs in GSM mobile phones, for example. Since a battery operated mobile phone transmits short bursts, the battery voltage Vbat decreases while the transmitter in the mobile phone is transmitting the bursts. This is schematically illustrated in FIG. 6 where the battery voltage (supply voltage) Vbat is reduced while the phone transmits the bursts. A GSM phone typically transmits bursts during a period that is about 0.58 ms long (GSM time slot of 0.577 ms which repeats at the frame rate of 4.615 ms). During the rest of the time ("quiet" portion A), the battery voltage Vbat reaches its nominal value since the other processes in a mobile phone do not strongly burden the battery. These kind of fluctuations of the supply voltage are also visible if one analyses the filtered output voltage V_fil schematically depicted in FIG. 6. The variations of the filter voltage V_fil are much lower, but one still can see the influence of the burst transmissions.

Another improved embodiment of the present invention is now described. This embodiment is based on the embodiments depicted in the FIGS. 4 and 5A. It is a preferred embodiment for employment in a mobile phone, since it reduces or avoids the impact of the burst transmissions described above. The impact by the burst transmissions is an interference that occurs in regular time intervals. In the improved embodiment, a synchronous clock is used and the inventive filter apparatus is sampled during the "quiet" portions A of the interference period. This is possible since the slot timing information is known to the circuitry of the mobile phone. According to this improved embodiment, the filter apparatus is sampled at a time outside the 0.58 ms slots.

Figure 7:
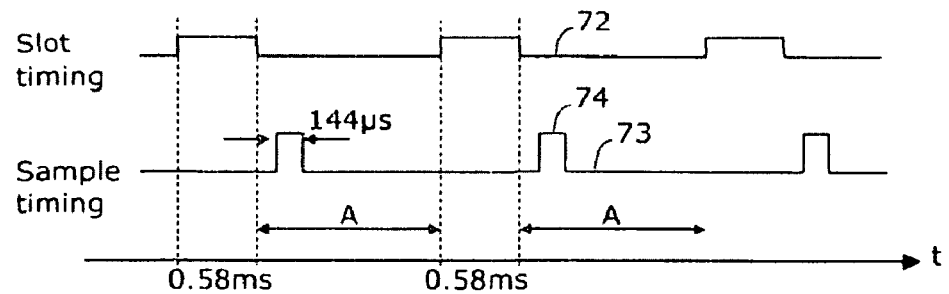
FIG. 7 shows a schematic diagram of the slot timing and the sample timing in a mobile phone, according to the present invention.

As schematically illustrated in FIG. 7, a period 74 during the "quiet" portion A—with some margin—may be used for the sampling. The curve 72 represents the slot timing of the GSM phone and the curve 73 represents the sample timing. Since the circuitry of the mobile phone knows when the bursts are transmitted (during the 0.58 ms slots in FIG. 7), the unfiltered voltage V_unfil may be filtered only during a short sample period 74 (e.g. a period that is 144 μs), as depicted in FIG. 7. During the rest of the time, the filtering is switched off and fluctuations of the battery voltage Vbat 70 have no impact on the filtered voltage V_fil.

Figure 5B:
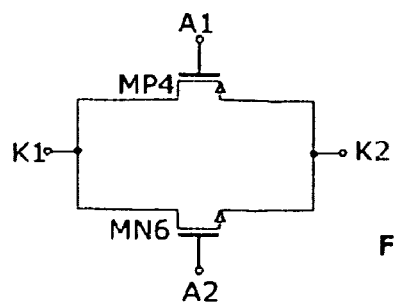
FIG. 5B shows a switching circuit that can be used in connection with the second apparatus, according to the present invention.

The sampling can also be done by switching one or more of the transistors in FIG. 5A. If one switches the current mirrors 43, 44 off for a period of time while the phone transmits the bursts, the capacitor C1 keeps the output voltage V_fil constant even if the supply voltage (Vbat) shows fluctuations. As soon as the burst transmission is over, the current mirrors 43, 44 can be switched back on (with a short delay margin) and the filtering is continued. The switching can be done by means of a switched PMOS transistor MP2 and a switched NMOS transistor MN3, for example. In FIG. 5B one possible switching circuit is illustrated that can be inserted into the circuit of FIG. 5A between the two terminals K1 and K2. The switching circuit is a complementary switch comprising a PMOS MP4 and an NMOS transistor MN6. This switching circuit is situated between the input node 49 and the two transistors MP2, MN3. The switching can be controlled by applying a logic signal close to VDD to the node A1 and a logic signal close to ground to the node A2.

Instead of the switching circuit of FIG. 5B, one may employ an NMOS switch between the transistors MP3 and MN5 and a PMOS switch between the transistors MP1 and MN2. These switches allow the current mirrors 41, 42 to be switched.

The capacitor C1 is able to keep the voltage V_fil constant, since the load at the output node 50 is a non-resistive load. The load thus will not de-charge the capacitor C1 noticeably. Due to the sampling, a much longer time constant τ can be achieved. Increases of τ of about 30 dB are possible. The reference filtering employed in the embodiments of FIGS. 4 and 5 can be further improved by the sampling approach described.

It is to be noted that the above mentioned parameters are just examples. The present invention will work with other parameters, too.

The on-chip capacitor (e.g. the capacitor C1 in FIG. 5A) may be a gate capacitor or a metal capacitor.

Figure 1:
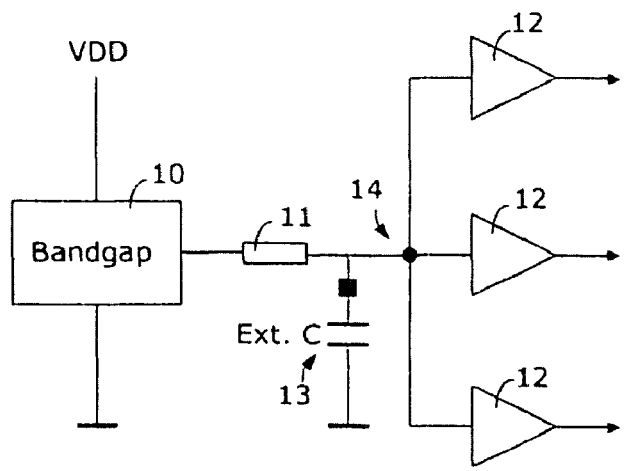
FIG. 1 shows a schematic block diagram of a conventional voltage reference circuit.
Figure 8:
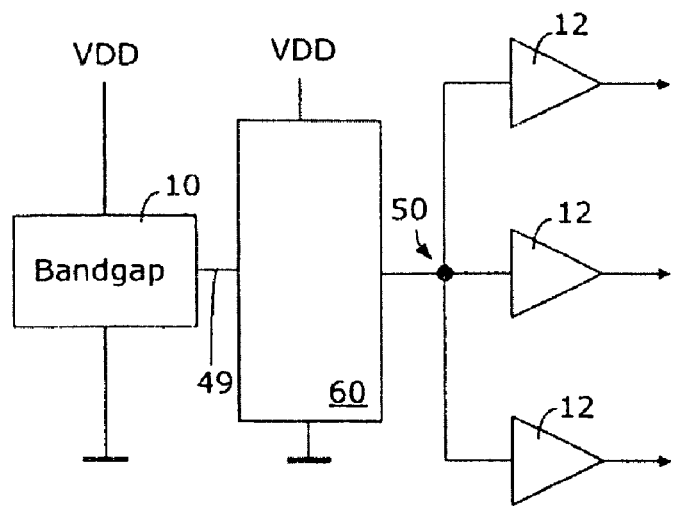
FIG. 8 shows a schematic block diagram of a third apparatus, according to the present invention.

In FIG. 8 another embodiment is depicted. This embodiment is similar to the one of FIG. 1. FIG. 8 is a block diagram of part of a mixed-signal integrated circuit of a mobile phone, for instance. A bandgap voltage reference 10 is used. The bandgap voltage provided at an output 49 may show interferences. For suppressing the interferences a filter apparatus 60, as depicted in FIG. 5A, may be employed. There is no need for an external filter capacitor since a respective capacitance is part of the apparatus 60. The voltage at the output node 50 is filtered and serves in the present example as input signal of a plurality of buffers 12.

Figure 2:
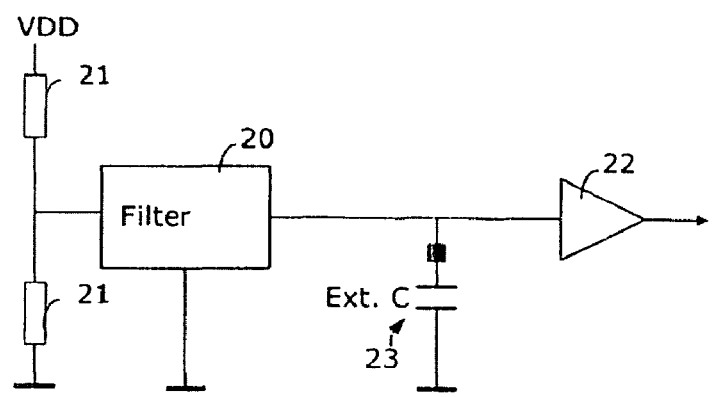
FIG. 2 shows a schematic block diagram of a conventional voltage reference circuit providing a reference voltage that is divided down from the supply voltage (VDD)
Figure 3:
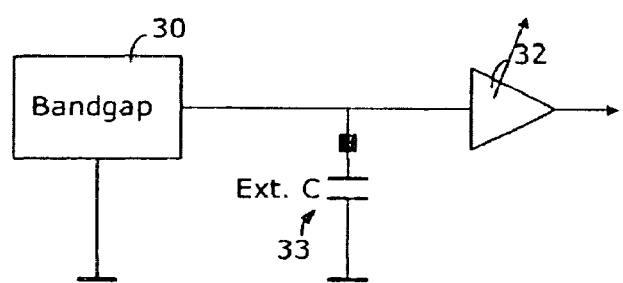
FIG. 3 shows a schematic block diagram of another conventional voltage reference circuit providing a reference voltage that is programmable.
Figure 9:
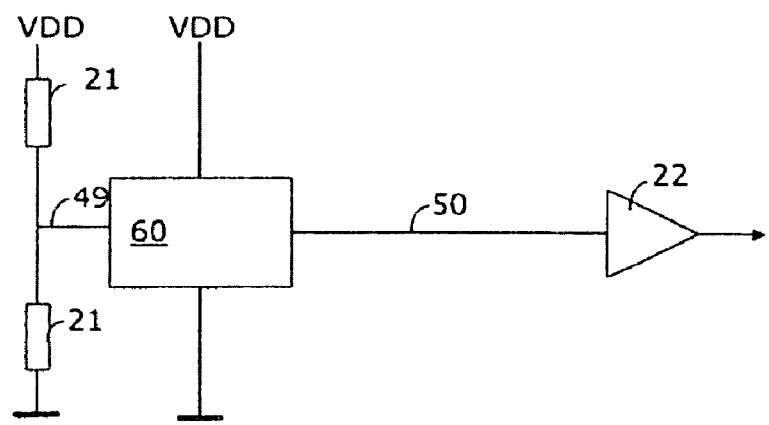
FIG. 9 shows a schematic block diagram of a fourth apparatus, according to the present invention.

In FIG. 9 yet another embodiment is depicted. This embodiment is similar to the one of FIG. 2. FIG. 9 is a block diagram of part of a mixed-signal integrated circuit of another mobile phone. The embodiment divides the power supply voltage VDD to half its value (or another value) and is then used for controlling the optimum working point of output stages 22. The dividing of the power supply voltage VDD is done by means of two resistors 21 or two CMOS transistors. Also in this circuit a filter apparatus 60 with on-chip capacitor may be employed, as depicted in FIG. 9.

According to the present invention, the bandgap noise as well as power-supply noise is filtered in order to be able to provide a clean (filtered) output voltage V_fil. According to a preferred embodiment, the differential filtering resistive circuit is switched with the goal of sampling at a moment where the interferences are low. The invention, if used in a mobile phone, allows interferences to be prevented from influencing the analog audio part of the phone.

It is appreciated that various features of the invention which are, for clarity, described in the context of separate embodiments may also be provided in combination in a single embodiment. Conversely, various features of the invention which are, for brevity, described in the context of a single embodiment may also be provided separately or in any suitable subcombination.

In the drawings and specification there has been set forth preferred embodiments of the invention and, although specific terms are used, the description thus given uses terminology in a generic and descriptive sense only and not for purposes of limitation.

The invention claimed is:

1. An apparatus, comprising
    a voltage input for receiving an unfiltered voltage,
    a current input for receiving a bias current from a current source,
    common output node for providing a filtered output voltage,
    a differential filtering resistive circuit comprising a complementary arrangement of first current mirror and a second current mirror, being situated between the common output node and said voltage input,
    a filtering stage with a first mirror circuit for mirroring said bias current to said first current mirror, and a second mirror circuit for mirroring a current to said second current mirror, and
    a filter capacitor connected on a first side to said common output node and on a second side to a voltage reference terminal.

2. The apparatus of claim 1, wherein said first current mirror is a PMOS current mirror, and said second current mirror is an NMOS current mirror.

3. The apparatus of claim 2, wherein said PMOS current mirror comprises a first PMOS transistor and a second PMOS transistor having gates that are jointly connected to an output of said first mirror circuit, and sources that are jointly connected to said voltage input, and wherein a drain of said first PMOS transistor is also connected to said output of said first mirror circuit, and a drain of said second PMOS transistor is connected to said common output node.

4. The apparatus of claim 2, wherein said NMOS current mirror comprises a first NMOS transistor and a second NMOS transistor having gates that are jointly connected to an output of said second mirror circuit, and sources that are jointly connected to said voltage input, and wherein a drain of said first NMOS transistor is also connected to said output of said second mirror circuit, and a drain of said second NMOS transistor is connected to said common output node.

5. The apparatus of claim 4, wherein said PMOS current mirror comprises a first PMOS transistor and a second PMOS transistor having gates that are jointly connected to an output of said first mirror circuit, and sources that are jointly connected to said voltage input, and wherein a drain of said first PMOS transistor is also connected to said output of said first, mirror circuit, and a drain of said second PMOS transistor is connected to said common output node. wherein said second PMOS transistor and said second NMOS transistor are each configured as a pass resistor.

6. The apparatus of claim 1, wherein said complementary arrangement is configured to source current into said filter capacitor or to sink current out of said filter capacitor.

7. The apparatus claim 1, comprising means for switching off said apparatus during periods while a supply voltage of said apparatus is lowered due to repetitive loading.

8. The apparatus of claim 7, wherein the means include a switched PMOS transistor and a switched NMOS transistor.

9. The apparatus of claim 7, wherein the means include at least one of a switched current mirror, and a switched voltage input.

10. A mobile phone, comprising:
an apparatus that includes:
  a voltage input for receiving an unfiltered voltage,
  a current input for receiving a bias current from a current source,
  common output node for providing a filtered output voltage,
  a differential filtering resistive circuit comprising a complementary arrangement of first current mirror and a second current mirror, being situated between the common output node and said voltage input,
  a filtering stage with a first mirror circuit for mirroring said bias current to said first current mirror, and a second mirror circuit for mirroring a current to said second current mirror, and
  a filter capacitor connected on a first side to said common output node and on a second side to a voltage reference terminal.

11. The mobile phone of claim 10, further comprising a battery configured to provide a supply voltage which is lowered during periods while said phone transmits bursts in a repetitive fashion.

12. The mobile phone of claim 11, comprising means for switching of said apparatus during said periods.

* * * * *